(12) United States Patent
Lee

(10) Patent No.: US 6,346,724 B1
(45) Date of Patent: Feb. 12, 2002

(54) SEMICONDUCTOR MEMORY DEVICE HAVING A CAPACITOR OVER BIT-LINE STRUCTURE AND METHOD FOR MANUFACTURING THE SAME

(75) Inventor: Joo-young Lee, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/702,797

(22) Filed: Nov. 1, 2000

Related U.S. Application Data

(62) Division of application No. 09/154,783, filed on Sep. 17, 1998, now Pat. No. 6,180,448.

(30) Foreign Application Priority Data

Mar. 2, 1998 (KR) .............................. 98-6799

(51) Int. Cl.[7] ..................... H01L 27/108; H01L 29/76; H01L 29/94; H01L 21/8242
(52) U.S. Cl. ................... 257/306; 257/307; 438/253
(58) Field of Search ................... 257/303, 307, 257/306; 438/253, 254, 255, 257, 396

(56) References Cited

U.S. PATENT DOCUMENTS

| | | | |
|---|---|---|---|
| 5,392,232 A | * | 2/1995 | Kim et al. ..................... 365/51 |
| 5,405,800 A | * | 4/1995 | Ogawa et al. ............... 438/253 |
| 5,444,005 A | | 8/1995 | Kim et al. ................... 438/396 |
| 5,488,007 A | | 1/1996 | Kim et al. ................... 438/698 |
| 5,574,680 A | | 11/1996 | Kim et al. ................... 365/149 |
| 5,620,917 A | | 4/1997 | Yoon et al. ................. 438/253 |
| 5,786,273 A | | 7/1998 | Hibi et al. .................. 438/637 |
| 5,895,947 A | | 4/1999 | Lee et al. .................... 257/303 |

OTHER PUBLICATIONS

Pan et al., D. Ma, "Integrated Interconnect Module Development", pp. 46–51, Jun. 18–20, 1996 VMIC Conference, 1996, ISMIC–106/96/0046(c).

* cited by examiner

*Primary Examiner*—Charles Bowers
*Assistant Examiner*—Brook Kebede
(74) *Attorney, Agent, or Firm*—Volentine Francos, PLLC

(57) ABSTRACT

A semiconductor memory device having an improved step profile between a cell array region and peripheral circuit region, and a method for manufacturing the same, are provided. The semiconductor memory device has a cell array region and a peripheral circuit region surrounding the cell array region. The cell array region includes a plurality of cell capacitors each of which comprises a cell storage electrode and a plate electrode, and a plurality of dummy cell capacitors each of which comprises a dummy storage electrode and a plate electrode. The dummy cell capacitors are formed at the edges of the cell array region. The outermost sidewall of each dummy storage electrode, facing toward the peripheral circuit region, has an inclined profile.

14 Claims, 5 Drawing Sheets

SEMICONDUCTOR MEMORY DEVICE HAVING A CAPACITOR OVER BIT-LINE STRUCTURE AND METHOD FOR MANUFACTURING THE SAME

CROSS REFERENCE TO RELATED APPLICATIONS

This is a divisional application of application Ser. No. 09/154,783 filed Sep. 17, 1998 now U.S. Pat. No. 6,180,448, which is hereby incorporated by reference in its entirety for all purposes.

BACKGROUND OF THE INVENTION

1. Field of the Invention

The present invention relates to a semiconductor memory device and a method for manufacturing the same, and more particularly, to a highly integrated semiconductor memory device having a capacitor over bit-line (COB) cell structure, and to a method for manufacturing the same.

2. Description of the Related Art

As semiconductor memory devices such as dynamic random access memories (DRAMs) become more highly integrated, it is very important to develop a process for increasing their cell capacitance and securing a process margin for forming a fine metal interconnection. In general, a surface step is formed between a cell array region, where a storage electrode is formed, and a peripheral circuit region for driving the cells. In the process of forming these metal interconnections on a substrate where the surface step is formed, a technology for uniformly forming a metal interconnection in the cell array region and the peripheral circuit region is very important.

In particular, in highly integrated 256 M-bit DRAMs and above, the height of the storage electrode of the capacitor is increased to 1 μm in order to secure cell capacitance. At this time, a step generated between the cell array region and the peripheral circuit region is also formed at a height of 1 μm. Thus, it is very difficult to uniformly form a metal interconnection over the cell region and the peripheral circuit region even after a subsequent process of planarization.

FIG. 1 is a sectional view of a conventional DRAM device.

Referring to FIG. 1, reference numeral 10 denotes a semiconductor substrate; reference numeral 12 denotes a word line acting as a gate electrode of an access transistor formed in a cell array region; reference numeral 13 denotes a first interdielectric layer covering the access transistor; reference numeral 14 denotes a bit line connected to a source region (or drain region) of the access transistor; reference numeral 16 denotes a second interdielectric layer covering the surface of the resultant structure where the bit line 14 is formed; reference character C1 denotes a storage electrode connected to the drain region (or source region) of the access transistor; reference character C2 denotes a plate electrode covering the cell array region of the resultant structure where the storage electrode C1 is formed; reference numeral 18 denotes a third interdielectric layer covering a cell array region and a peripheral circuit region of the resultant structure where the plate electrode C2 is formed; and reference numeral 20 denotes a metal interconnection formed on the third inter dielectric layer 18.

As described above, in the conventional memory device, a COB structure is widely used to obtain sufficient cell capacitance. That is, in order to form a high performance capacitor, a COB structure where a three-dimensional cell capacitor is formed on a semiconductor substrate over a bit line, is widely employed in DRAM devices. However, although increasing the height of the storage electrode formed in a restricted unit cell area allows the desired cell capacitance to be obtained, it also increases a step "h" between the cell array region and the peripheral circuit region, as shown in FIG. 1. Thus, if photoresist is coated on the third interdielectric layer by a spin coating method, there is a large difference in the thickness of the photoresist layer between the cell array region and a peripheral circuit region. This reduces a focus margin during a photo-lithography process, and a photoresist pattern having abnormal profile is formed in the cell array region and the peripheral circuit region. Accordingly, it is difficult to normally etch using the photoresist pattern as an etching mask, because the photoresist pattern has an abnormal profile.

In order to reduce the step between the cell array region and the peripheral circuit region, there is a method for excessively planarizing the third interdielectric layer. However, in this case the depth of a metal contact hole formed by etching the first through third interdielectric layers is increased. As a result, it is more difficult to improve the reliability of the metal interconnection filling the metal contact hole.

SUMMARY OF THE INVENTION

To solve the above problems, it is an objective of the present invention to provide a highly integrated semiconductor memory device having a larger process margin during photolithography and etch process for forming a subsequent metal interconnection, due to a slow gradient between a cell array region and a peripheral circuit region.

It is another objective of the present invention to provide a method of manufacturing the highly integrated semiconductor memory device.

Accordingly, to achieve the first objective, a semiconductor memory device is provided having a cell array region and a peripheral circuit region, wherein the cell array region comprises: a plurality of cell storage electrodes, a plurality of dummy storage electrodes arranged at a periphery of the cell array region to surround the plurality of cell storage electrodes, and plate electrode formed over the plurality of cell storage electrodes and the plurality of dummy storage electrodes, wherein an outermost sidewall of each dummy storage electrode adjacent to the peripheral circuit region has an inclined profile.

Preferably, the dummy storage electrode is formed of the same material as the cell storage electrode, and the angle of inclination of the outermost sidewall of the dummy storage electrode is 40°~70°.

The cell array region includes a semiconductor substrate having an access transistor comprising a source region electrically connected to the cell storage electrode, a drain region spaced apart from the source region, a channel region interposed between the source region and the drain region, an insulating layer formed over the channel region, and a gate electrode formed over the insulating layer; and a bit line electrically connected to the drain region of the access transistor, Preferably, the outmost sidewalls of the dummy storage electrodes, facing toward the outside of the cell array region, are inclined. The gradient of the sidewalls of the dummy storage electrodes is preferably 40°~70°.

To achieve the second objective, a plurality of cell storage electrodes are formed over a semiconductor substrate in the cell array region. A plurality of dummy storage electrodes are then formed over the semiconductor substrate in the cell array region, and around the plurality of cell storage electrodes. The dummy storage electrodes have dummy sidewalls of an inclined profile facing toward the peripheral circuit region and formed. Then, a plate electrode is formed in the cell array region over the plurality of cells storage electrodes and over the plurality of dummy storage electrodes.

In more detail, a first interdielectric layer is formed in a cell array region where a plurality of access transistors are formed and in a peripheral circuit region where a plurality of peripheral circuit transistors are formed. The first interdielectric layer is patterned to form a plurality of bit line contact holes exposing source regions (or drain regions) of the access transistors, and a plurality of bit lines covering the plurality of contact holes are formed. A second interdielectric layer is formed on the entire surface of the semiconductor substrate where the plurality of bit lines are formed, and the second interdielectric layer and the first interdielectric layer are patterned to form a plurality of storage contact holes exposing drain regions (or source regions) of the access transistors. A plurality of storage electrodes covering the storage contact holes are formed in the cell array region. At this time, outmost storage electrodes, i.e., a dummy storage electrodes positioned at the edges of the cell array region, are formed in a shape different from the cell storage electrode. In other words, the sidewall of the dummy storage electrode facing toward the peripheral circuit region is inclined. A dielectric layer and a plate electrode are formed in sequence in a cell array region where the plurality of storage electrodes are formed. Actually, no information is stored in the dummy storage electrode. The dummy storage electrode is formed to merely alleviate the loading effect, to thereby improve the pattern uniformity of all cell storage electrodes.

A conductive layer filling the storage contact hole, e.g., a doped polysilicon layer, is formed on the entire surface of the semiconductor substrate where a plurality of storage contact holes are formed, in order to form the dummy storage electrodes having the inclined sidewalls. A plurality of photoresist patterns are formed on the conductive layer of the cell array region. Spacers are formed on the sidewalls of the photoresist patterns. A first dry etching process is performed to a predetermined depth using the spacers and the photoresist patterns as an etching mask. The first dry etching process is performed using, a predetermined etching gas, e.g., $Cl_2$ gas and $N_2$ gas. At this time, a material of the conductive layer etched by the $Cl_2$ gas, i.e., polysilicon, reacts with the photoresist patterns to generate polymers. The polymers are mostly generated by the peripheral circuit region. This is because the exposed area of the conductive layer in the peripheral circuit region is wider than that in the cell array region. Thus, a great deal of polymers adhere to the sidewall of the stepped portion of the conductive layer formed by the first dry etching process, adjacent to the peripheral circuit region. The photoresist patterns are eliminated and cylindrical storage electrodes are formed by performing a second dry etching process, etching a conductive layer using the spacers as an etching mask until the second interdielectric layer is exposed.

At this time, the second dry etching process is performed using $Cl_2$ gas and $N_2$ gas. By the second dry etching process, the sidewalls of the cell storage electrodes are formed vertically, and the outer sidewalls of the dummy storage electrodes are formed with a slope. This is caused by polymers generated by the first dry etching process adhering to the sidewalls of the conductive layer. Preferably, the gradient of the inclined sidewalls is 40°~70°.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENT

Figure 1:
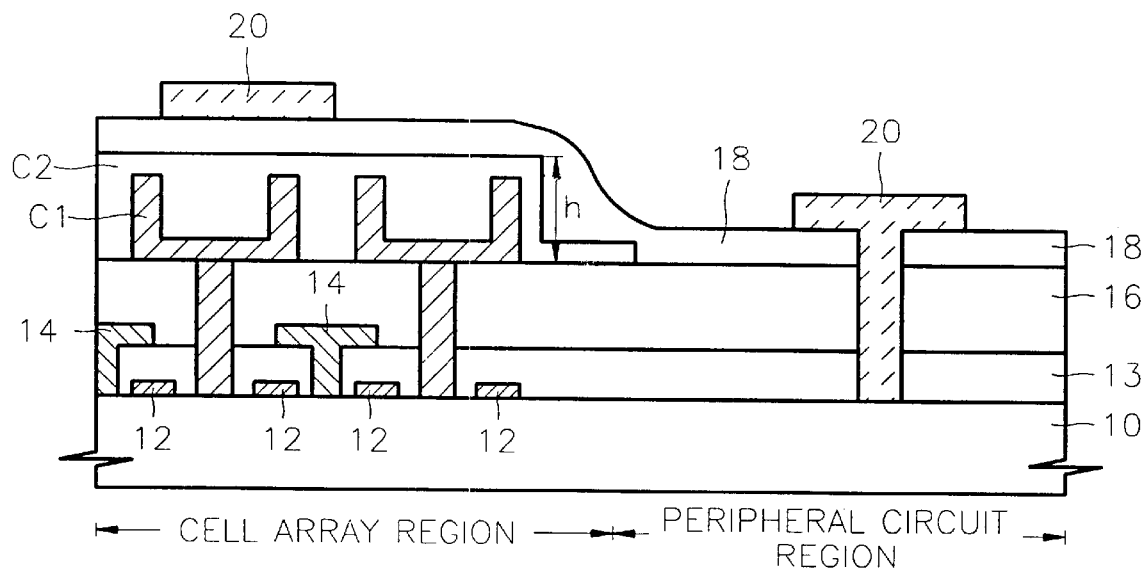
FIG. 1 is a sectional view of a conventional semiconductor memory device.

The present invention now will be described more fully hereinafter with reference to the accompanying drawings, in which a preferred embodiment of the present invention is shown. This invention may, however, be embodied in many different forms and should not be construed as being limited to the embodiments set forth herein. For example, the present invention may be used for a semiconductor memory device having a storage electrode of a box type as well as a cylinder type. Rather than being limiting, these embodiments are provided so that this disclosure will be thorough and complete, and will fully convey the concepts of the invention to those skilled in the art. In the attached drawings, like numbers refer to like elements throughout. In addition, the thickness of layers and regions in the drawings are exaggerated for clarity. It will also be understood that when a layer is referred to as being "on" another layer or substrate, it can be directly on the other layer or substrate, or intervening layers may also be present.

Figure 2:
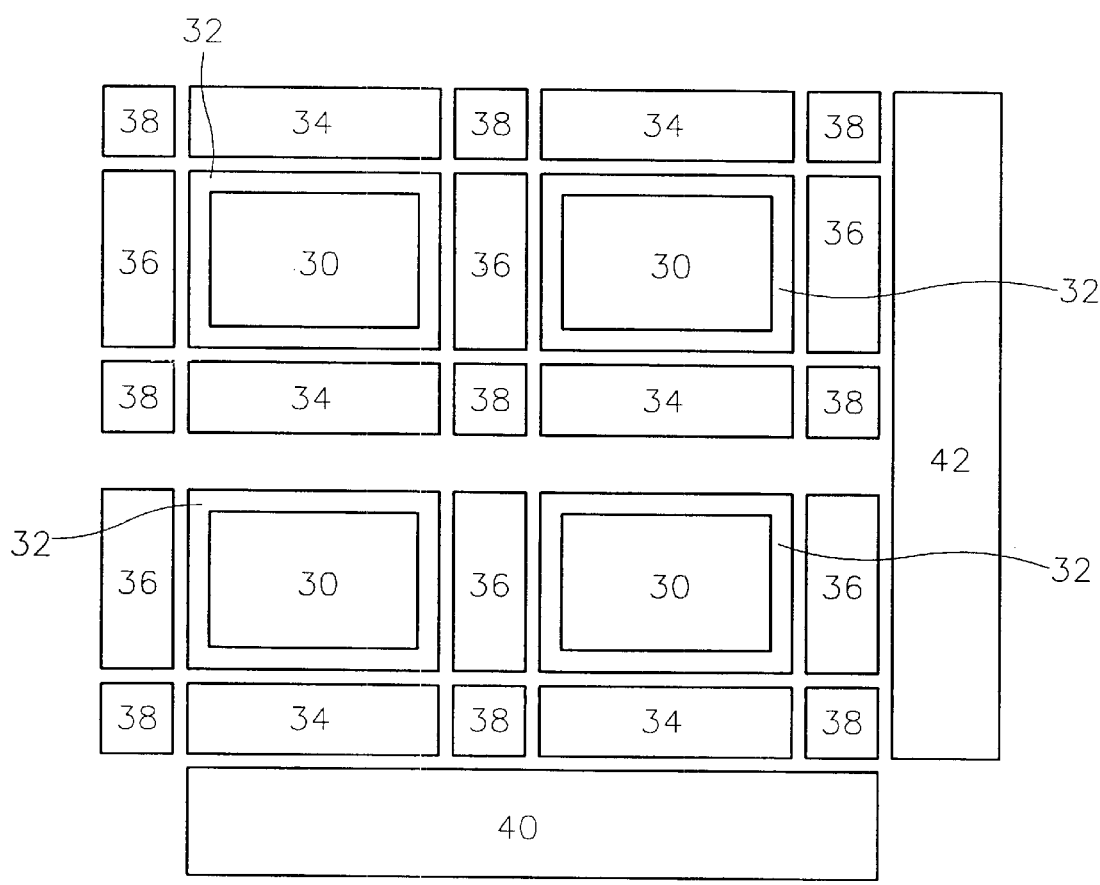
FIG. 2 is a block diagram showing arrangement of a cell array region and a peripheral region of a typical semiconductor memory device.

Referring to FIG. 2, a semiconductor memory device, i.e., a DRAM device, includes four memory cell array blocks 30; dummy cell regions 32 arranged in the peripheral portion of each of the memory array blocks; sense amplifiers 34 arranged to the upper and lower of the memory cell array blocks 30; a sub word line driver (SWD) 36 arranged at both sides of the memory cell array block 30; conjunctions 38 arranged between the sense amplifiers 34; a column decoder 40 arranged at lower of the memory cell array blocks 30; and a row decoder 42 arranged on the right side of the memory cell array blocks 30.

A dummy cell including a dummy storage electrode is not a main cell for storing information, but reduces the loading effect when a storage electrode of the main cell is patterned. In other words, the dummy storage electrode helps to uniformly form the storage electrodes all over the cell array region.

Figure 3:
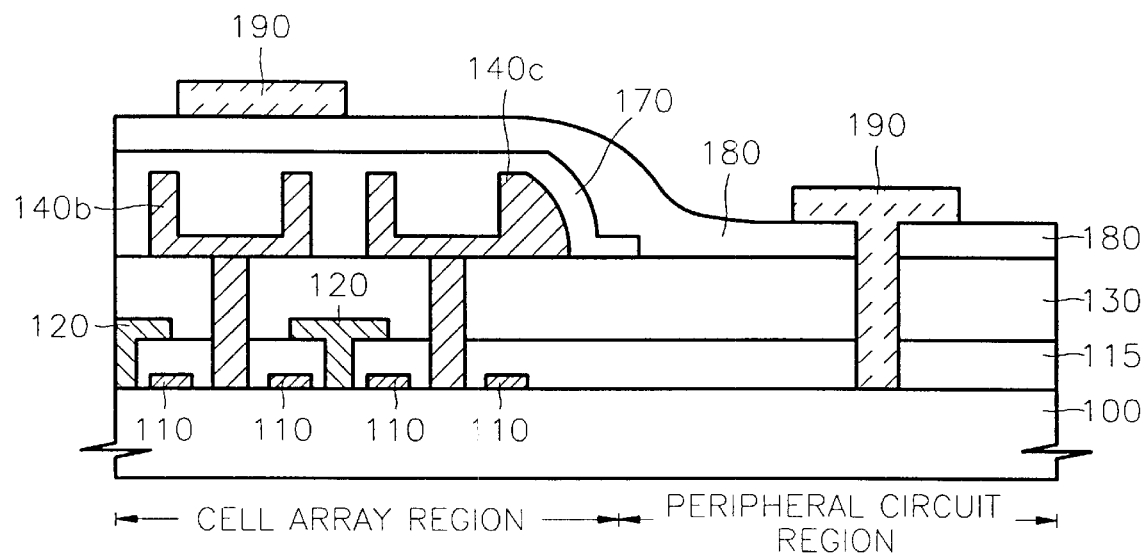
FIG. 3 is a sectional view of a semiconductor memory device according to a preferred embodiment of the present invention.

Referring to FIG. 3, according to a preferred embodiment of a semiconductor memory device of the present invention, a word line 110 is positioned in a cell array region of a semiconductor substrate 100 where an isolation layer (not shown) is formed. The word line 110 acts as a gate electrode of an access transistor constituting a memory cell, while the isolation layer (not shown) defines an active region. In addition, a first interdielectric layer 115 is positioned on the entire surface of the semiconductor substrate where the access transistor is formed. A bit line 120 is connected to a source region (or a drain region) of the access transistor through a bit line contact hole formed by patterning the first interdielectric layer 115. A second interdielectric layer 130 covers the entire surface of the semiconductor substrate where the bit line 120 is formed.

Also, a storage electrode 140b of a main cell and a storage electrode 140c of a dummy cell connected to the drain regions (or source region) of the access transistors are positioned on the second interdielectric layer 130 and pass through the storage contact hole formed by patterning the second and first interdielectric layers 130 and 115 in sequence.

A plate electrode 170 covering the storage electrode 140b of the main cell and the storage electrode 140c of the dummy cell is formed only on the cell array region, and a third interdielectric layer 180 is positioned on the entire surface of the semiconductor substrate where the plate electrode 170 is formed. A metal interconnection 190 is positioned on the third interdielectric layer 180. A sidewall of the dummy storage electrode 140c, facing toward the peripheral circuit region has a slope of less than 90°. In this way, the interdielectric layer 180 has a gradual surface step as shown in FIG. 3.

FIGS. 4A through 4F are sectional views illustrating a method for manufacturing a semiconductor memory device according to an embodiment of the present invention.

Figure 4A:
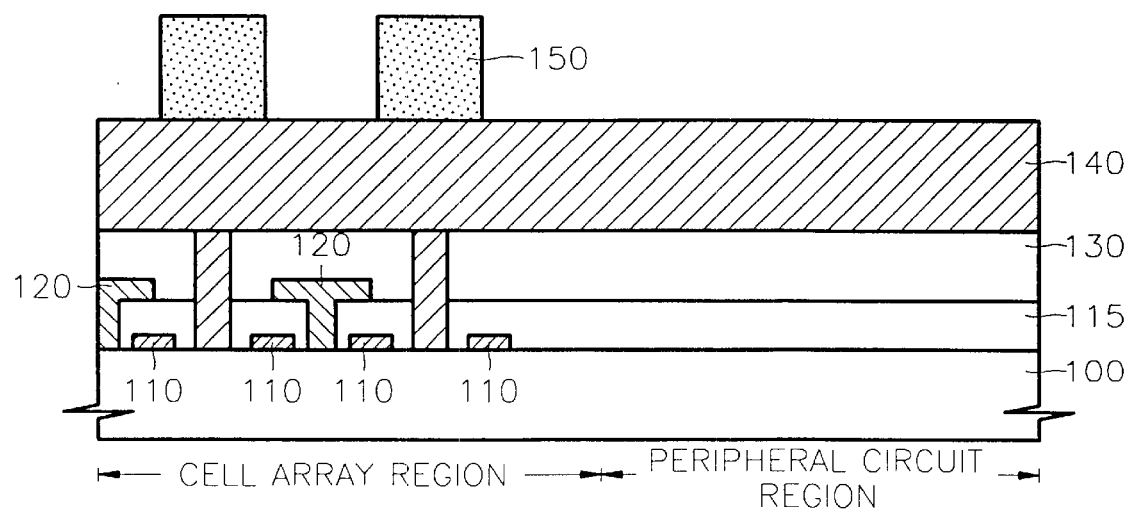
FIGS. 4A through 4F are sectional views illustrating a method for manufacturing a semiconductor memory device according to a preferred embodiment of the present invention.

Referring to FIG. 4A, a plurality of word lines 110 are formed in a cell array region of a semiconductor substrate 100 where an isolation layer (not shown) defining an active region is formed. At this time, a plurality of gate electrodes (not shown) are formed in a peripheral circuit region. A first interdielectric layer 115 is formed on the entire surface of the semiconductor substrate where the word lines 110 are formed, and the first interdielectric layer 115 is patterned to form a bit line contact hole exposing a source region (or drain region) of the access transistor.

A conductive layer filling the contact hole is formed on the entire surface of the semiconductor substrate where the bit line contact hole is formed, and the conductive layer is patterned to form bit lines 120 covering and filling the bit line contact hole.

A second interdielectric layer 130 is then formed on the entire surface of the semiconductor substrate where the bit lines 120 are formed, and the second and first interdielectric layers 130 and 115 are patterned in sequence to form a storage contact hole exposing the drain region (or source region) of the access transistor.

A conductive layer 140 filling the storage contact hole is formed on the entire surface of the semiconductor substrate where the storage contact hole is formed. Preferably, the conductive layer 140 is a doped polysilicon layer. Photoresist is then coated on the conductive layer 140, and then the photoresist layer is patterned to form a photoresist pattern 150 over the storage contact hole.

Figure 4B:
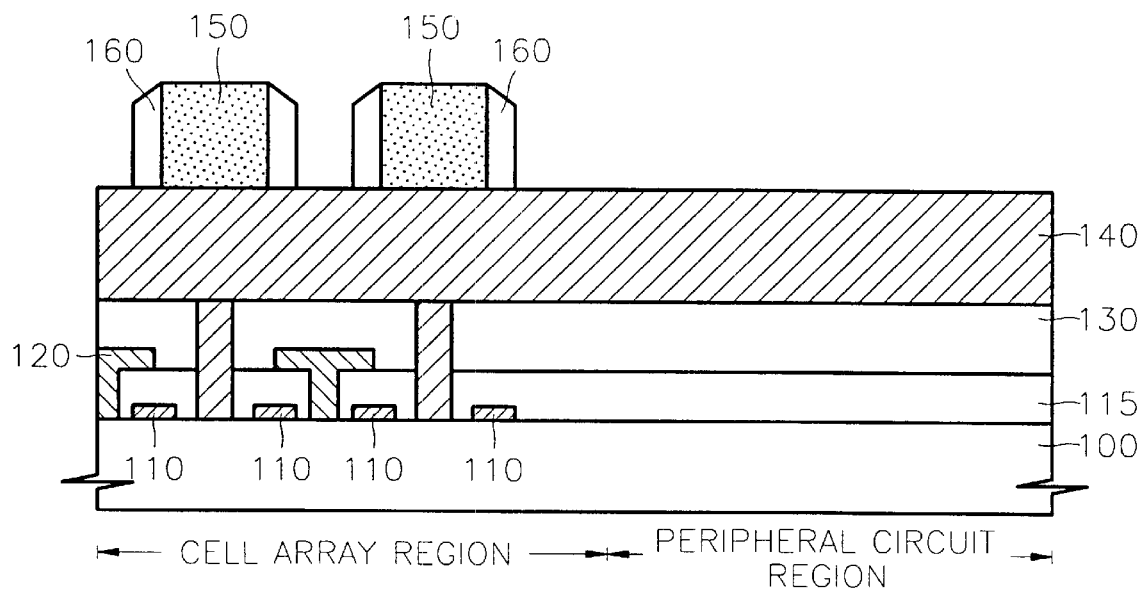

Referring to FIG. 4B, spacers 160 are formed on both sides of the photoresist pattern 150. The spacers 160 must be formed of a material having an etch rate lower than that of the conductive layer 140 to be formed in a subsequent process, in a range of temperature that suppresses deformation of the photoresist pattern 150. Preferably, the spacers 160 are formed of a plasma oxide layer capable of being deposited at 200° C. or lower.

Figure 4C:
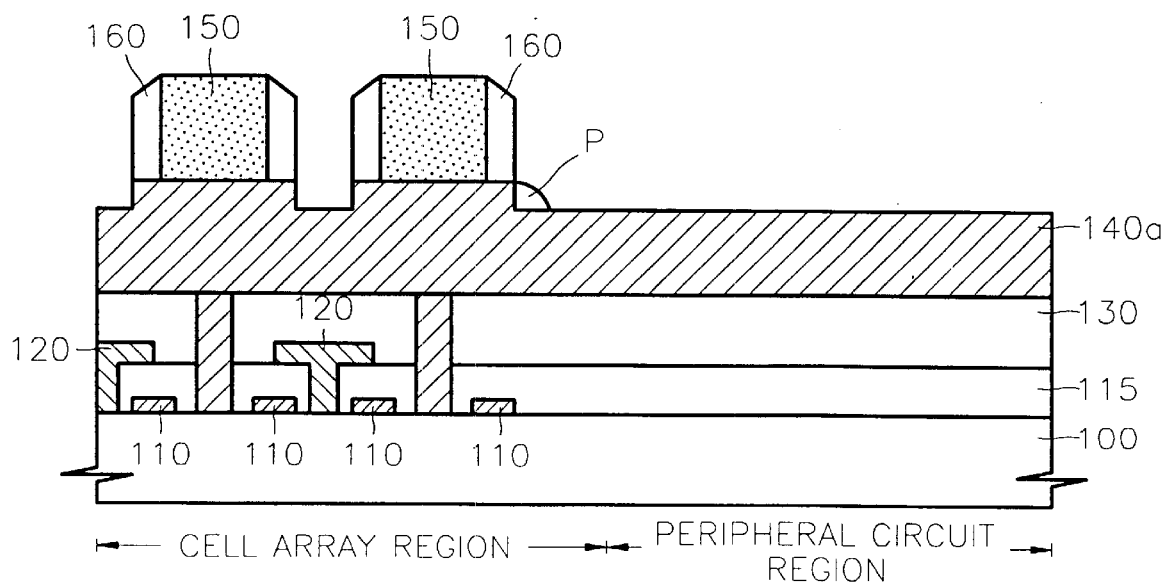

Referring to FIG. 4C, a stepped conductive layer 140a is formed by a first dry etching process of anisotropically etching the conductive layer 140 to a predetermined depth using the spacers 160 and the photoresist pattern 150 as an etching mask.

At this time, the first dry etching is preferably performed under 2.5 mTorr. Preferably, an etching gas for the first dry etching process is $Cl_2$ gas and $N_2$ gas, and radio frequency (RF) powers of 99 W and 498 W are supplied to a lower electrode supporting the semiconductor substrate and an upper electrode positioned above the lower electrode, respectively. It is also preferable that the lower electrode be maintained at approximately 40° C. Preferably, the flow rates of $Cl_2$ and $N_2$ gases are 28 sccm and 6 sccm, respectively.

In the first dry etching process, a polymer (P) having a predetermined width adheres to the sidewalls of the stepped conductive layer 140a adjacent to the peripheral circuit region, as shown in FIG. 4C. The polymer (P) is generated in the peripheral circuit region, so that no polymer adheres to the sidewalls of the conductive layer 140a in the cell array region. This is because the amount of the etched conductive layer 140a in the peripheral circuit region is generated to be more than that in the cell array region.

Figure 4D:
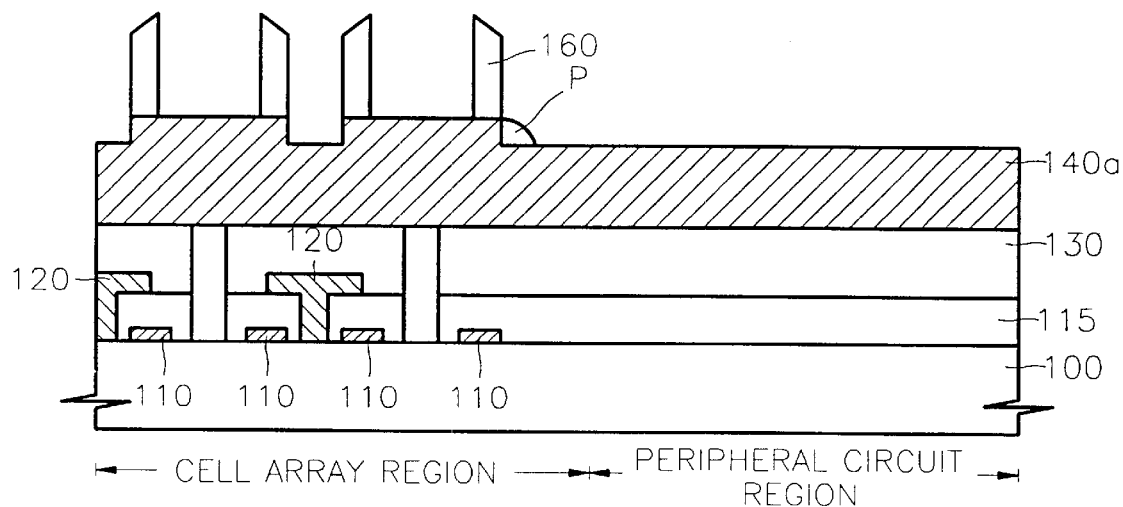
Figure 4E:
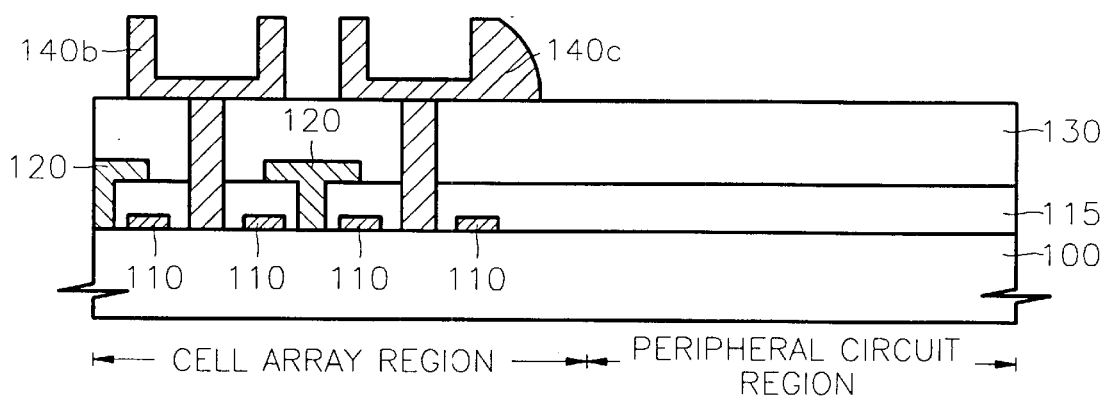

Referring to FIGS. 4D and 4E, the photoresist patterns 150 are then removed, and a second dry etching process is then performed, anisotropically etching the conductive layer 140a until the second interdielectric layer 130 is exposed, using the spacers 160 as an etching mask. At this time, the etching depth is controlled enough to leave the conductive layer 140a remaining to a predetermined thickness on the storage contact holes, to form cylindrical storage electrodes 140b and 140c as shown in FIG. 4E.

Preferably, an etching gas for the second dry etching process is $Cl_2$ gas and $N_2$ gas. At this time, preferably, the pressure in the chamber where a semiconductor substrate having the conductive layer 140a is loaded is controlled to approximately 2.5 mTorr, and RF powers of 152 W and 398 W are preferably supplied to a lower electrode supporting the semiconductor substrate and an upper electrode over the lower electrode, respectively. It is also preferable that the lower electrode is controlled to be approximately 40° C. It is preferable that the flow rates of $Cl_2$ and $N_2$ gas injected into the chamber are 32 sccm and 6 sccm, respectively.

If the stepped conductive layer 140a is etched by the second dry etching process, the sidewall of the dummy storage electrode 140c formed at the edge of the cell array region facing the peripheral circuit region has an inclined profile, as shown in FIG. 4E. This is caused by the polymers (P) adhered to the sidewalls of the stepped conductive layer 140a in the first dry etching process, and polymers generated during the second dry etching process. Preferably, the angle of inclination of the outermost sidewall of the dummy storage electrode 140c between 40° to 70°.

Figure 4F:
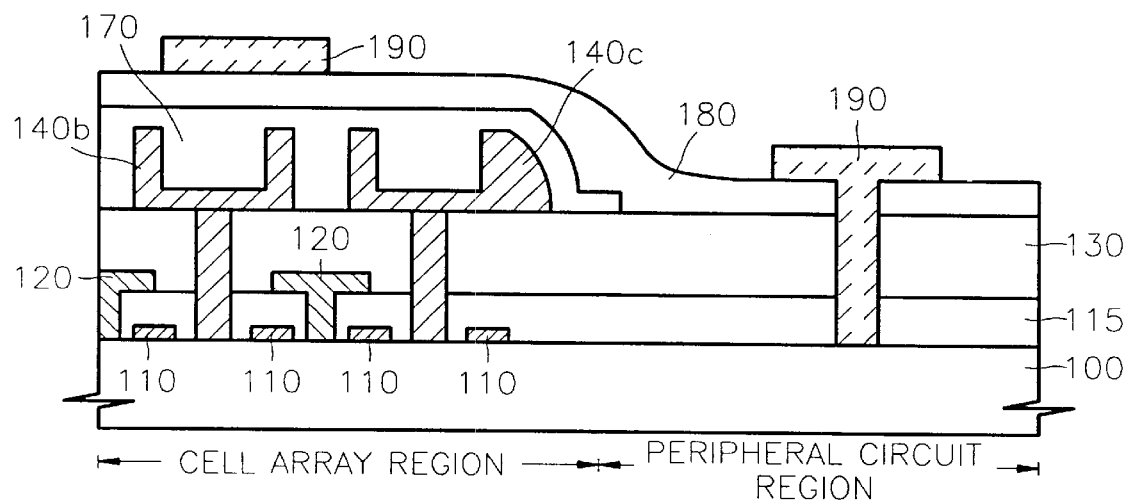

FIG. 4F is a sectional view illustrating the steps of forming a plate electrode 170, a third interdielectric layer 180, and a metal interconnection 190.

In detail, a dielectric layer (not shown) and a conductive layer for a plate electrode, e.g., a doped polysilicon layer, are formed on the entire surface of the resultant structure where the storage electrodes 140b and 140c are formed. The conductive layer is patterned to form the plate electrode 170 covering only the cell array region. Subsequently, a third interdielectric layer 180 is formed in the usual manner. Here, the third interdielectric layer may be formed of a reflowed BPSG layer at 850~900° C.

The third, second and first interdielectric layers 180, 130 and 115 are then patterned in sequence to form a metal contact hole exposing the semiconductor substrate 100 in a peripheral circuit region, e.g., a source/drain region of the transistor. A metal layer is then formed filling the metal contact hole, and the formed metal layer is then patterned to form a metal interconnection 190.

As described above, according to the semiconductor memory device, the sidewall of the dummy storage electrode positioned at the edge of the cell array region facing toward the peripheral circuit region has an inclined profile. Thus, the surface gradient of the interdielectric layer covering a step between the cell array region and the peripheral circuit region can be improved. As a result, in a subsequent process of patterning the metal interconnection, a process margin can be increased.

What is claimed is:

1. A semiconductor memory device having a cell array region and a peripheral circuit region, wherein the cell array region comprises:

a plurality of cell storage electrodes;

a plurality of dummy storage electrodes arranged at a periphery of the cell array region to surround the plurality of the cell storage electrodes; and a plate electrode formed over the plurality of cell storage electrodes and the plurality of dummy storage electrodes,
      wherein an outermost sidewall of each dummy storage electrode adjacent to the peripheral circuit region has an inclined profile that is convex.

2. A semiconductor memory device as recited in claim 1, wherein an angle of inclination of the outermost sidewall of the plurality of dummy storage electrodes is in a range of 40°~70°.

3. A semiconductor memory device as recited in claim 1, wherein the dummy storage electrodes are formed of a same material as the cell storage electrodes.

4. A semiconductor memory device as recited in claim 3, wherein the dummy storage electrodes are formed of polysilicon.

5. A semiconductor memory device as recited in claim 1, wherein the cell array region further comprises:

an access transistor comprising
      a source region electrically connected to a cell storage electrode,
      a drain region spaced apart from the source region,
      a channel region interposed between the source region and the drain region,
      an insulating layer formed over the channel region, and
      a gate electrode formed over the insulating layer; and a bit line electrically connected to the drain region of the access transistor.

6. A semiconductor memory device as recited in claim 5, wherein the dummy storage electrodes are formed of polysilicon.

7. A semiconductor memory device as recited in claim 1, wherein the cell storage electrodes and the dummy storage electrodes are each formed to be one of a cylinder type and a box type.

8. A semiconductor memory device comprising:

a plurality of cell storage electrodes in a cell array region; and at least one dummy storage electrode arranged at a periphery of the cell array region, an outermost sidewall of each of said at least one dummy storage electrode facing away from the cell array region having an inclined surface that is outwardly convex.

9. The semiconductor memory device of claim 8, further comprising a plate electrode formed over said plurality of cell storage electrodes and said at least one dummy storage electrode, said plate electrode including an outermost sidewall facing away from the cell array region that has an inclined surface that is outwardly convex.

10. The semiconductor memory device of claim 8, further comprising a peripheral circuit region located outward from said at least one dummy storage electrode.

11. The semiconductor memory device of claim 8, wherein said plurality of cell storage electrodes and said at least one dummy storage electrode are cylindrical shaped.

12. The semiconductor memory device of claim 8, wherein said plurality of cell storage electrodes and said at least one dummy storage electrode are formed of a same material.

13. The semiconductor memory device of claim 8, wherein the same material is polysilicon.

14. The semiconductor memory device of claim 8, wherein an angle of inclination of the inclined surface is in a range of 40 to 70 degrees.

\* \* \* \* \*